(12) United States Patent
Kommrusch

(10) Patent No.: US 6,654,439 B1
(45) Date of Patent: Nov. 25, 2003

(54) HIGH SPEED LINEAR FEEDBACK SHIFT REGISTER

(75) Inventor: Steve Kommrusch, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/873,512

(22) Filed: Jun. 4, 2001

(51) Int. Cl.[7] ............................................. G11C 19/00
(52) U.S. Cl. ............................. 377/54; 377/77; 377/80; 377/81
(58) Field of Search ............................. 377/54, 77, 80, 377/81

(56) References Cited

U.S. PATENT DOCUMENTS

| 5,090,035 A | * | 2/1992 | Murase | 377/72 |
| 5,105,376 A | * | 4/1992 | Pedron | 364/717 |
| 5,867,409 A | * | 2/1999 | Nozuyama | 364/717.03 |
| 6,061,417 A | * | 5/2000 | Kelem | 377/26 |

* cited by examiner

Primary Examiner—Margaret R. Wambach

(57) ABSTRACT

An apparatus and method for providing a high speed linear feedback shift register is disclosed. The high speed linear feedback shift register of the present invention comprises multiplexer flip flop circuits. The multiplexer gate on the input of each flip flop circuit is the only gate between each pair of flip flop circuits of the present invention. The linear feedback shift register of the present invention is capable of operating as a counter that does not need to be reset. The linear feedback shift register of the present invention may be used as a clock divider circuit.

16 Claims, 4 Drawing Sheets

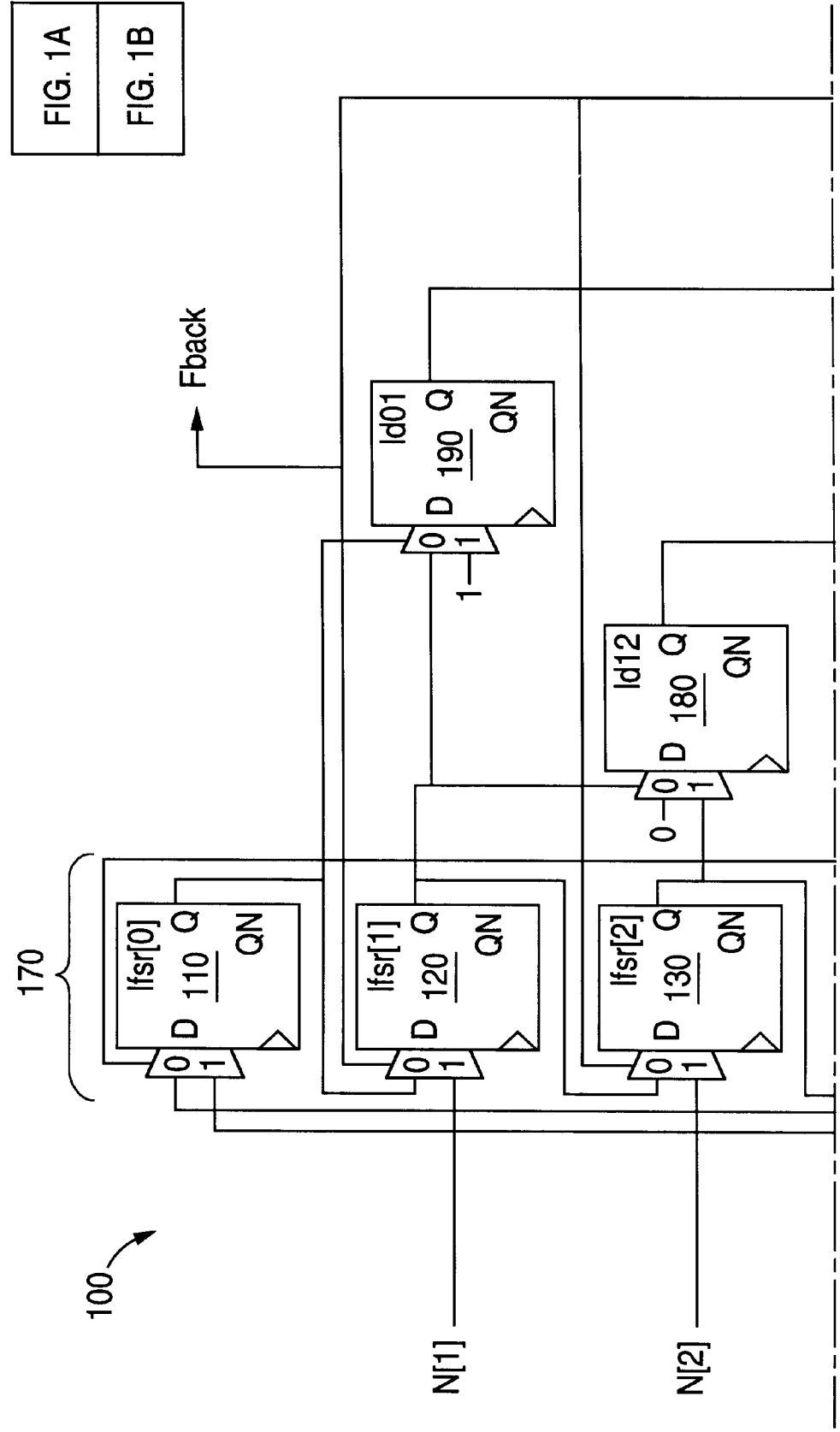

HIGH SPEED LINEAR FEEDBACK SHIFT REGISTER

FIELD OF THE INVENTION

The present invention relates generally to integrated circuits. More particularly, the present invention relates to an improved apparatus and method for providing a high speed linear feedback shift register.

BACKGROUND OF THE INVENTION

The use of linear feedback shift registers is well known in integrated circuit technology. Linear feedback shift registers may be used in a number of applications. For example, a linear feedback shift register may be used to implement a clock divider circuit. A clock divider circuit is used to divide a master clock signal to obtain a different frequency clock signal.

Prior art linear feedback shift registers typically use additional logic circuitry to perform auxiliary functions. For example, when a linear feedback shift register is used as a counter, additional logic circuitry must be used to reset the counter.

It would be desirable to have a linear feedback shift register that would not need to employ additional logic circuitry of the type used in prior art devices.

It would also be desirable to have a linear feedback shift register that was capable of operating as a counter that did not need to be reset.

It would also be desirable to have a linear feedback shift register that was capable of operating at a faster rate than prior art linear feedback shift registers.

SUMMARY OF THE INVENTION

The present invention is directed to an apparatus and method for providing a high speed linear feedback shift register (LFSR).

An advantageous embodiment of the present invention comprises a high speed linear feedback shift register that substantially comprises only multiplexer flip flops. The multiplexer gate on the input of each flip flop is the only gate between each flip flop of the LFSR of the present invention. This feature increases the speed of the LFSR of the present invention to a level that is approximately twenty percent (20%) faster than the speed of prior art linear feedback shift registers.

It is an object of the present invention to provide an apparatus and method for providing a high speed linear feedback shift register that does not need to employ additional logic circuitry of the type used in prior art linear feedback shift registers.

It is another object of the present invention to provide an apparatus and method for providing a high speed linear feedback shift register that is capable of operating as a counter that does not need to be reset.

It is also an object of the present invention to provide an apparatus and method for providing a high speed linear feedback shift register that is capable of operating at a faster rate than prior art linear feedback shift registers.

It is still another object of the present invention to provide an apparatus and method for providing a high speed linear feedback shift register for a clock divider for a high speed phase locked loop.

It is yet another object of the present invention to provide an apparatus and method for a high speed linear feedback shift register that does not require multiple stages of logic circuitry to detect an end condition.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which:

FIG. 1A schematically illustrates a first portion of an exemplary high speed linear feedback shift register comprising twelve (12) mux flip flop circuits according to an advantageous embodiment of the present invention;

DETAILED DESCRIPTION OF THE INVENTION

FIGS. 1A through 4, discussed below, and the various embodiments used to describe the principles of the present invention in this patent document are by way of illustration only and should not be construed in anyway to limit the scope of the invention. Those skilled in the art will understand that the principles of the present invention may be implemented in any suitably arranged linear feedback shift register.

Figure 1B:
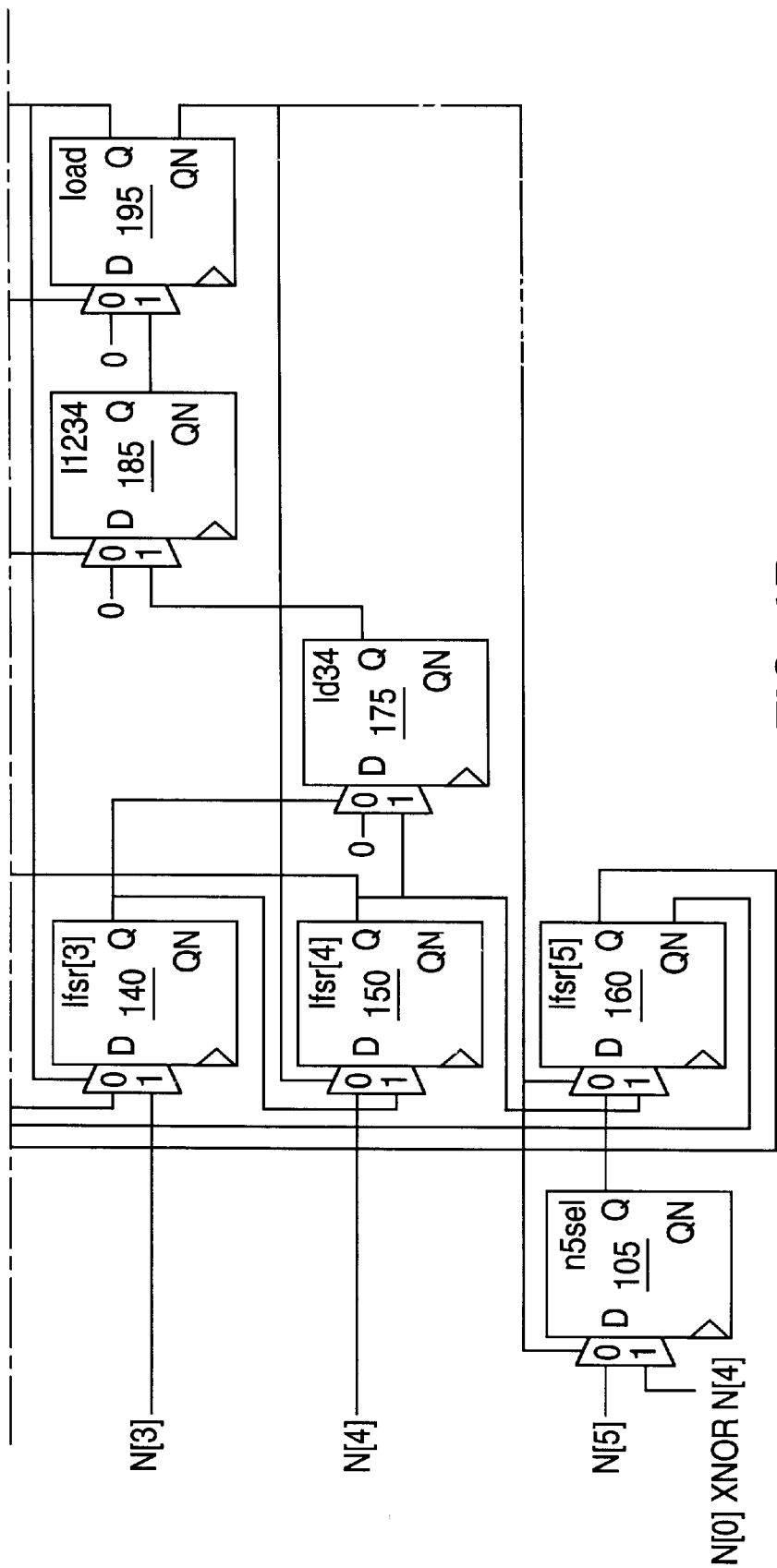
FIG. 1B schematically illustrates a second portion of an exemplary high speed linear feedback shift register comprising twelve (12) mux flip flop circuits according to an advantageous embodiment of the present invention.

The present invention provides an apparatus and method for providing a high speed linear feedback shift register. FIG. 1 (comprising FIG. 1A and FIG. 1B) illustrates an advantageous embodiment of the high speed linear shift register (LFSR) 100 of the present invention. LFSR 100 comprises twelve (12) multiplexer (mux) flip flops. Each multiplexer (mux) flip flop will be referred to by the letters "FF." The counter circuit of LFSR 100 comprises FF 100 through FF 160, shown in FIG. 1 aligned in a vertical column. The counter circuit of LFSR 100 (FF 110 through FF160) will be referred to as counter 170.

A clock signal (designated "Fvco") is provided to all of the twelve (12) mux flip flops shown in FIG. 1. The circuits that provide the Fvco clock signal to each of the twelve (12) mux flip flops are not shown in FIG. 1. The Fvco clock signal clocks all twelve (12) mux flip flops on the positive edge of the clock.

As shown in FIG. 1, LFSR 100 receives six (6) inputs, N[I], where the index I takes on integer values from zero (0) to five (5). The present invention is not limited to linear feedback shift registers having six (6) inputs. The number six (6) is illustrative only. It is clear that the principles of the present invention may be utilized in liner feedback shift registers having more than six (6) inputs.

The inputs, N[I], shown in FIG. 1 are multiplexer (mux) input clock signals. Input N[1] is provided to the "1" input of the mux of FF 120. Input [2] is provided to the "1" input of the mux of FF 130. Input [3] is provided to the "1" input of the mux of FF 140. Input N[4] is provided to the "0" input of the mux of FF 150. Input N[5] is provided to the "0" input of the input of the mux of FF 105. Input N[0] and input N[4] are exclusively NORed and the result is provided to the "I" input of the mux of FF 105. FF 105 controls the loading of data into counter 170. The Q output of FF 105 is provided to the "0" input of the mux of FF 160.

The outputs of counter 170 are provided to FF 175, FF 180, FF 185, FF 190 and FF 195. These mux flip flops detect when counter 170 has reached its limit. The Q output of FF 195 (designated "load") provides a feedback signal (designated "Fback").

The Q output of FF 110 (designated "lfsr[0]") is provided to the "0" input of the mux of FF 120 and to the "select" input of the mux of FF 190. The Q output of FF 120 (designated "lfsr[1]") is provided to the "0" input of the mux of FF 130 and to the "0" input of the mux of FF 190 and to the "select" input of the mux of FF 180.

The Q output of FF 130 (designated "lfsr[2]") is provided to the "0" input of the mux of FF 140 and to the "1" input of the mux of FF 180. The Q output of FF 140 (designated "lfsr[3]") is provided to the "1" input of the mux of FF 150 and to the "select" input of the mux of FF 175.

The Q output of FF 150 (designated "lfsr[4]") is provided to the "1" input of the mux of FF 160 and to the "1" input of the mux of FF 175 and to the "select" input of the mux of FF 110. The Q output of FF 160 (designated "lfsr[5]") is provided to the "1" input of the mux of FF 110. The Q output of FF 105 (designated "n5sel") is provided to the "0" input of the mux of FF 160.

The Q output of FF 180 (designated "ld12") is provided to the "select" input of the mux of FF 185. The "0" input of the mux of FF 180 is provided with a "0" input signal. The Q output of FF 175 (designated "ld34") is provided to the "1" input of the mux of FF 185. The "0" input of the mux of FF 175 is provided with a "0" input signal.

The Q output of FF 190 (designated "ld01") is provided to the "select" input of the mux of FF 195. The "1" input of the mux of FF 190 is provided with a "1" input signal. The Q output of FF 185 (designated "l1234") is provided to the "1" input of the mux of FF 195. The "0" input of the mux of FF 185 is provided with a "0" input signal.

The Q output of FF 195 (designated "load") is provided to the "select" input of the mux of FF 120. The "0" input of the mux of FF 195 is provided with a "0" input signal. The QN output of FF 195 is provided to the "select" input of the mux of FF 105 and to the "select" input of the mux of FF 160. The QN output of FF 195 is also provided to the "select" input of the mux of FF 150.

Input N[5] is provided to the "0" input of the mux of FF 105. Input N[0] is exclusively NORed with Input N[4] and the result of the exclusive NOR operation is provided to the "1" input of the mux of FF 105.

As described above, with the exception of the circuit for performing the exclusive NOR operation of Input N[0] and Input N[4], LFSR 100 is composed solely of twelve (12) mux flip flops. In this advantageous embodiment of the present invention there is only one (1) gate between each flip flop. That gate is the multiplexer (mux) on the D input of each mux flip flop. By utilizing fast mux flip flops, this advantageous embodiment of the present invention is capable of operating approximately twenty percent (20%) faster than prior art LFSRs that must employ additional logic circuits.

In addition, the advantageous embodiment of the present invention in LFSR does not require reset circuitry. The unique construction of LFSR 100 enables counter 170 to power up in any configuration of flip flop settings. The normal operation of counter 170 will automatically correct any "bad" settings. A separate reset circuit (of the type used in prior art LFSRs) is not necessary in LFSR 100.

An additional advantage of LFSR 100 is that the load condition is detectable from only four (4) bits and not from all six (6) bits. The four (4) bit load detection feature also protects against LFSR 100 from getting locked up in an "all ones" condition. The four (4) bit load occurs for two (2) cycles. This means that the exclusive NOR feedback does not require additional load logic. The input registers are merely controlled for two (2) cycles via the "n5sel" signal from FF 105.

Because only four (4) bits are used for load detection, the other two (2) bits can be in any state and trigger the load. One of these states is the "all ones" state and two of these states are the valid "end of loop" condition. The final state (i.e., lfsr=30) occurs in the free running counter only five (5) states after the valid "end of loop" condition (lfsr=31 and 62). Therefore, the five (5) lfsr load values between 62 and 30 are not legal divider controls. If, however, LFSR 100 starts in these states then LFSR 100 will recover. For additional detail, refer to a section hereinbelow entitled "Verilog for pipelined load" that sets forth a software model of the operation of LFSR 100 in Verilog code. A full mapping of load settings (N) to resulting division is given in the Verilog code.

In LFSR 100 the pipelining of the load calculation requires two (2) extra mux flip flops, FF 175 and FF 180. As previously mentioned, FF 175 provides an output signal designated "ld34" and FF 180 provides an output signal designated "ld12." A robustness in the pipeline design of LFSR 100 is provided by FF 185 and FF 190. FF 185 provides an output signal designated "l1234" and FF 190 provides an output signal designated "ld01." FF 185 and FF 190 insure than any glitches that are due to random flip flop start values will ultimately clear up and that counter 170 will function properly. FF 185 and FF 190 prevent a load from occurring when the count equals thirty (count=30). The "ld01" output will be "low" after count=30 since the count will equal sixty (count=60).

Figure 2:
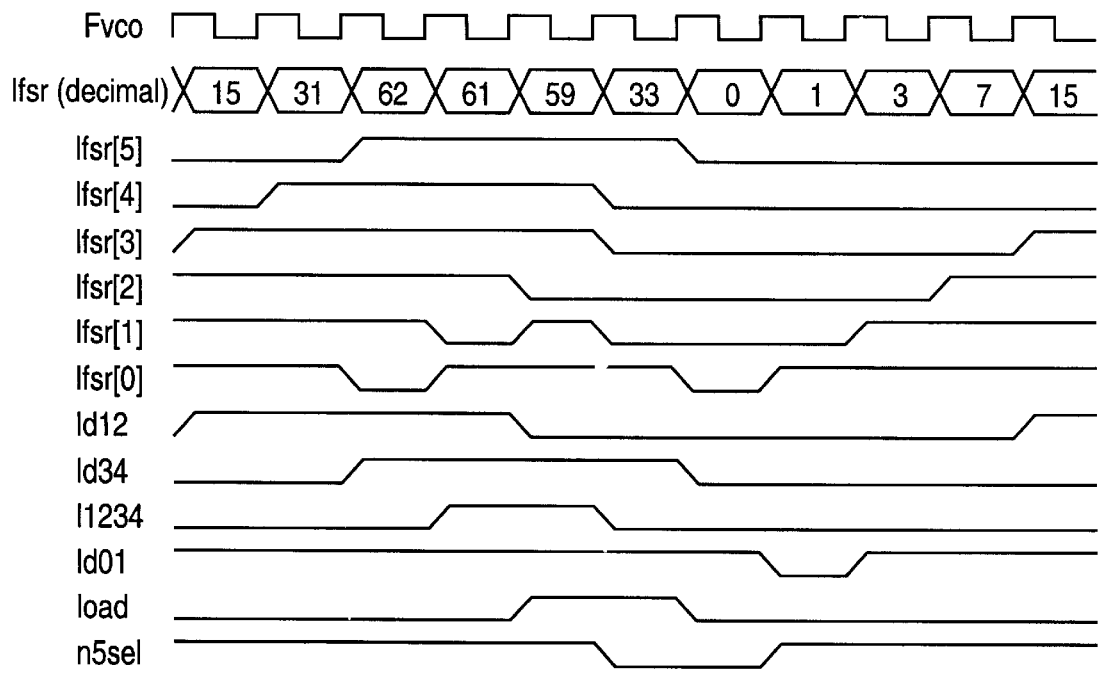
FIG. 2 schematically illustrates an exemplary timing diagram for the high speed linear feedback shift register shown in FIG. 1A and FIG. 1B.

FIG. 2 schematically illustrates an exemplary timing diagram for LFSR 100 shown in FIG. 1. The timing diagram is for a condition with N=0, and for a divide by ten (10) with a pipelined load. The first line at the top of FIG. 2 designated "Fvco" illustrates the Fvco clock signal that is provided to all twelve (12) mux flip flops of LFSR 100. The second line in FIG. 2 designated "lfsr (decimal)" identifies the decimal numbers of the count at their respective positions. The remaining lines illustrate the following signals: lfsr[5], lfsr[4], lfsr[3], lfsr[2], lfsr[1], lfsr[0], ld12, ld34, l1234, id01, load, and n5sel.

The behavior of output signal "n5sel" of FF 105 is shown in FIG. 2. During the first cycle of the load, bit five, N[5], is set "high" so that bit four, N[4], exclusively NORed with bit zero, N[0], will clear bit zero, N[0], on the next cycle. Also during the second load cycle, output signal "n5sel" is "low" so ultimately the desired load of zero ("0") occurs two (2) states after the lfsr (decimal) count is set to sixty one (61).

Figure 3:
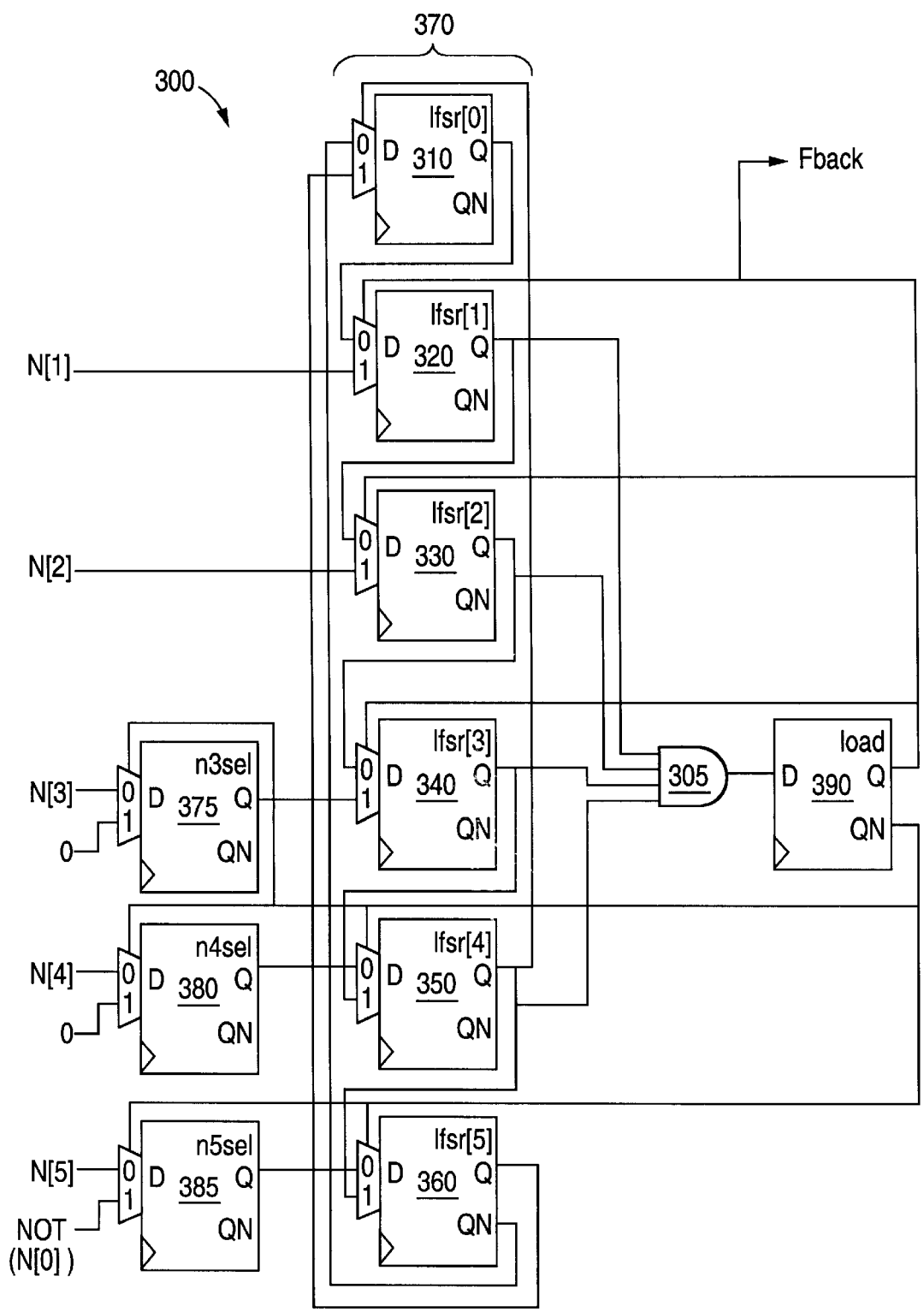
FIG. 3 schematically illustrates an exemplary high speed linear feedback shift register comprising ten (10) mux flip flop circuits and a four input AND gate according to an advantageous embodiment of the present invention.

FIG. 3 illustrates an alternate advantageous embodiment of the high speed linear feedback shift register (LFSR) 300 of the present invention. LFSR 300 comprises a four (4) input AND gate 305, nine (9) multiplexer (mux) flip flops (310 through 385), and one (1) flip flop 390. Each flip flop will be referred to by the letters "FF." The counter circuit of LFSR 300 comprises FF 310 through FF 360, shown in FIG. 3 aligned in a vertical column. The counter circuit of LFSR 300 (FF 310 through FF 360) will be referred to as counter 370.

A clock signal (designated "Fvco") is provided to all of the ten (10) flip flops shown in FIG. 3. The circuits that provide the Fvco clock signal to each of the ten (10) flip flops are not shown in FIG. 3. The Fvco clock signal clocks all ten (10) flip flops on the positive edge of the clock.

As shown in FIG. 3, LFSR 300 receives six (6) inputs, N[I], where the index I takes on integer values from zero (0) to five (5). The inputs, N[I], are multiplexer (mux) input clock signals. Input N[1] is provided to the "1" input of the mux of FF 320. Input N[2] is provided to the "1" input of the mux of FF 330. Input N[3] is provided to the "0" input of the mux of FF 375. The "1" input of the mux of FF 375 is provided with a "0" input signal. Input N[4] is provided to the "0" input of the mux FF 380. The "1" input of the mux of FF 380 is provided with a "0" input signal.

Input N[5] is provided to the "0" input of the mux of FF 385. Input N[0] is provided to an inverter circuit (not shown) to obtain a value of NOT (N[0]). The input NOT (N[0]) is provided to the "1" input of the mux of FF 385.

FF 375, FF 380, and FF 385 control the loading of data into counter 370. The Q output of FF 375 (designated "n3sel") is provided to the "1" input of the mux of FF 340. The Q output of FF 380 (designated "n4sel") is provided to the "0" input of the mux of FF 350. The Q output of FF 385 (designated "n5sel") is provided to the "0" input of the mux of FF 360.

The Q output of FF 310 (designated "lfsr[0]") is provided to the "0" input of the mux of FF 320. The Q output of FF 320 (designated "lfsr[1]") is provided to the "0" input of the mux of FF 330 and to a first input of AND gate 305.

The Q output of FF 330 (designated "lfsr[2]") is provided to the "0" input of the mux of FF 340 and to a second input of AND gate 305. The Q output of FF 340 (designated "lfsr[3]") is provided to the "1" input of the mux of FF 350 and to a third input of AND gate 305.

The Q output of FF 350 (designated "lfsr[4]") is provided to the "1" input of the mux of FF 360 and to the "select" input of the mux of FF 310 and to a fourth input of AND gate 305. The Q output of FF 360 (designated "lfsr[5]") is provided to the "1" input of the mux of FF 310. The QN output of FF 360 is provided to the "0" input of the mux of FF 310.

The output of four (4) input AND gate 305 is provided to an input of FF 390. The Q output of FF 390 (designated "load") provides a feedback signal (designated "Fback"). The Q output of FF 390 is provided to the "select" input of the mux of FF 320 and is provided to the "select" input of the mux of FF 330 and is provided to the "select" input of the mux of FF 340.

The QN output of FF 390 is provided to the "select" input of the mux of FF 350 and to the "select" input of the mux of FF 380. The QN output of FF 390 is also provided to the "select" input of the mux of FF 360 and to the "select" input of the mux of FF 385.

As described above, with the exception of the inverter circuit for performing the NOT operation on Input N[0], LFSR 300 is composed solely of nine (9) mux flip flops and one (1) non-mux flip flop (FF 390). In this advantageous embodiment of the present invention there is only one (1) gate between each flip flop. That gate is either the multiplexer (mux) on the D input of each mux flip flop or four (4) input AND gate 305. By utilizing fast mux flip flops, this advantageous embodiment of the present invention is capable of operating approximately twenty percent (20%) faster than prior art LFSRs that must employ additional logic circuits.

In addition, the advantageous embodiment of the present invention in LRSR 300 does not require reset circuitry. The unique construction of LFSR 300 enables counter 370 to power up in any configuration of flip flop settings. The normal operation of counter 370 will automatically correct any "bad" settings. A separate reset circuit (of the type used in prior art LFSRs) is not necessary in LFSR 300.

For additional detail, refer to a section hereinbelow entitled "Verilog for 4-input AND load" that sets forth a software model of the operation of LFSR 300 in Verilog code. A full mapping of load settings (N) to resulting division is given in the Verilog code.

A robustness in the four (4) input AND gate design of LFSR 300 is provided by FF 375 and FF 380. FF 375 provides an output signal designated "n3sel" and FF 380 provides an output signal designated "n4sel." FF 375 and FF 380 insure than any glitches that are due to random flip flop start values will ultimately clear up and that counter 370 will function properly. FF 375 and FF 380 insure that one cycle pulses of the load signal cannot occur repetitively because bit 3, N[3], and bit 4, N[4], will get cleared immediately. Then counter 370 will proceed from a value that will ultimately end with the double load at thirty one (31) and sixty two (62).

Figure 4:
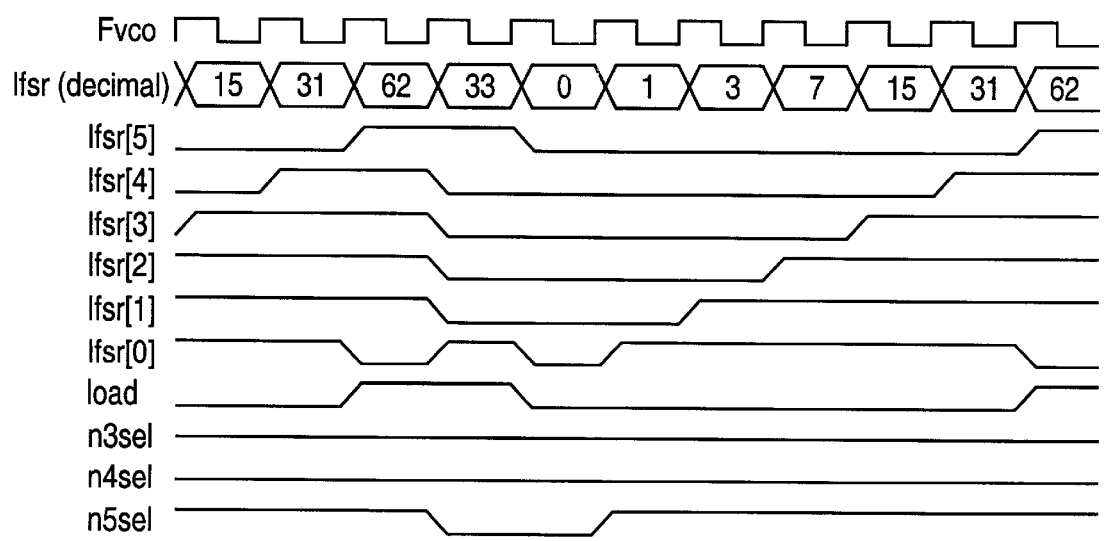
FIG. 4 schematically illustrates an exemplary timing diagram for the high speed linear feedback shift register shown in FIG. 3.

FIG. 4 schematically illustrates an exemplary timing diagram for LFSR 300 shown in FIG. 3. The timing diagram is for a condition with N=0, and for a divide by eight (8) with a four (4) input AND load. The first line at the top of FIG.

4 designated "Fvco" illustrates the Fvco clock signal that is provided to all ten (10) flip flops of LFSR 300. The second line in FIG. 4 designated "lfsr (decimal)" identifies the decimal numbers of the count at their respective positions. The remaining lines illustrate the following signals: lfsr[5], lfsr[4], lfsr[3], lfsr[2], lfsr[1], lfsr[0], load, n3sel, n4sel and n5sel.

A full analysis of state recovery is similar for both LFSR 100 and LFSR 300. Coming out of reset, assume that all internal flip flops are in a random state (i.e., an unknown state). Also assume that the N divider settings are stable. Either the load flip flop is "high" or at some point it will go "high." That is, the sequence will progress until either thirty (30), thirty one (31), or sixty three (63) occurs. If the "load" signal is active for two (2) cycles, then the signals "lfsr[5]" through "lfsr[1]" will be in a known state (i.e., bits N[5] through N[1] will be known).

If the full "lfsr (decimal)" count now proceeds to count thirty one (31), a clean two (2) cycle load will occur and the "lfsr (decimal)" count will cycle normally. If state thirty (30) is hit first, a one (1) state load occurs in LFSR 300 (the four (4) input AND version) which clears bit 3, N[3], and bit 4, N[4]. The "lfsr (decimal)" count will then proceed to state thirty one (31) because none of the states between state thirty one (31) and state thirty (30) have bit 3 and bit 4 clear. In LFSR 100 (the pipelined version) cycling to state thirty (30) will not cause a load.

With unknown values in the system, assume that the "load" signal is active for one (1) cycle. In LFSR 300 (the four (4) input AND version) either the count proceeds to state thirty one (31) and cycles cleanly or the count proceeds to state thirty (30) and recovers. In LFSR 100 (the pipelined version) lfsr bits four (4) through one (1) will get loaded with values N[4] through N[1], which can never be all "high." The state machine will then shift and lfsr bits five (5) through two (2) will be known. Output signals "ld12" and "ld34" will both be known and not both be "high." The next state will have the output signal "l1234" with a "low" value, and so forth.

```
Verilog for pipelined load
'timescale 1ps/1ps
// If you don't have debussy waves, remove the "fsdb" stuff near the end
// Run this using the command below to see a divide-by-51 count
// verilog lfsr0.v +define+lfsrstart="6\'b000000"
+define+otherstart="6\'b000000"
+define+Nconst="6\'b010110"
// Run this using the command below to see a divide-by-24 count
// verilog lfsr0.v +define+lfsrstart="6\'b111111"
+define+otherstart="6\'b111111"
+define+Nconst="6\'b000100"
// Here is a brief perl script to check that no power-up state of the 10
// internal registers can lock up a given count. Change Nconst and
// // "die" condition to try other counts besides N=46, divide=43.
'ifdef not_defined
perl -e '$Nconst=46;'\
-e 'for ($lfsrstart=62; $lfsrstart<64; $lfsrstart++) {'\
-e 'for ($otherstart=0; $otherstart<64; $otherstart++) {'\
-e 'open (V,"verilog lfsr0.v +define+lfsrstart=$lfsrstart
+define+otherstart=$otherstart
+define+Nconst=$Nconst | tee/tmp/$otherstart.out|");'\
-e '$pulse=0; while (<V>) {'\
-e 'if(/Feedback going high/) {'\
-e '$pulse++;'\
-e 'if($pulse == 5) {$old=$.+1};'\
-e 'if($pulse == 6) {die "Bad behavior,
see /tmp/$otherstart.out" if($.-$old != 43);};'\
-e'}}}}'
'endif
```

-continued

```
// This "zero-gate" LFSR counter counts the sequence below.
// (The LFSR uses no gates other than mux-input flops with
// Q and QN). Next to each number in the sequence is the
// effective feedback divider count if "N" is set to that
// count. Note that 63 is not in the sequence and is an
// illegal value for N. (If the lfsr powers up as 63, it
// will cause a load to occur and get to a legal value).
// Sequential
// LFSR
// Values Divide value if N is set to this sequence value
// 59    Illegal value for N, lfsr recovers from this state.
// 55    Illegal value for N, lfsr recovers from this state.
// 47    Illegal value for N, lfsr recovers from this state.
// 30    Illegal value for N, lfsr recovers from this state.
// 60    61
// 57    60
// 51    59
// 39    58
// 14    57
// 29    56
// 58    55
// 53    54
// 43    53
// 22    52
// 44    51
// 24    50
// 48    49
// 33    48
//  2    47
//  5    46
// 11    45
// 23    44
// 46    43
// 28    42
// 56    41
// 49    40
// 35    39
//  6    38
// 13    37
// 27    36
// 54    35
// 45    34
// 26    33
// 52    32
// 41    31
// 18    30
// 36    29
//  8    28
// 17    27
// 34    26
//  4    25
//  9    24
// 19    23
// 38    22
// 12    21
// 25    20
// 50    19
// 37    18
// 10    17
// 21    16
// 42    15
// 20    14
// 40    13
// 16    12
// 32    11
//  0    10
//  1     9
//  3     8
//  7     7
// 15     6
// 31    Illegal value for N, lfsr uses this state.
// 62    Illegal value for N, lfsr uses this state.
// 61    Illegal value for N, lfsr uses this state.
//       Note that one state after 61 will have
//       lfsr[0] set, lfsr[1] clear, lfsr[4:2] = N[4:2]
//       and lfsr[5] equal to N[0] XNOR N[4].
//       Two states after "61" and lfsr will be
//       N[5:0].
module lfsr_cnt(
```

-continued

```
N,//6 bits of F/B divider limit in LFSR count
Fvco,//PLL VCO output
Fback);//PLL feedback clock
input [5:0]N;//6 bits of F/B divider limit
inputFvco;//PLL VCO output
outputFback;//PLL feedback clock
reg [5:0] lfsr;   // This is the counter, running very fast
reg      ld12,ld34; // Use these flops to avoid 4-input AND gate
reg      load;      // Active for 2 states in normal operation (count=31,62)
                    // Also insures we don't power up stuck at count=63
reg      n5sel; // During the first load state, this register will be
                // the XNOR of bit 4 and bit 0, during the second
                // load state, bit 0 will get set correctly and this
                // register is the value for bit 5 in the counter.
reg      ld01;
reg      l1234;
assign Fback = load;
initial begin // {
   // Initialize from command line
   lfsr = 'lfsrstart;
   {load,n5sel,ld01,l1234,ldl2,ld34} = 'otherstart;
end// }
always @(posedge Fvco) begin
   // All flops can be mux-input flops with Q and QN outputs.
   // No other gates are needed in counter's critical path.
   lfsr[0] <= lfsr[4] ? lfsr[5] : ~lfsr[5];
   lfsr[1] <= load ? N[1] : lfsr[0];
   lfsr[2] <= load ? N[2] : lfsr[1];
   lfsr[3] <= load ? N[3] : lfsr[2];
   // Use "~load" for 3 flops to evenly load Q and QN of "load" flop
   lfsr[4] <= ~load ? lfsr[3] : N[4];
   lfsr[5] <= ~load ? lfsr[4] : n5sel;
   // The XNOR of the "N" bits is not a gate in the critical
   // timing path since the "N" bits are assumed stable.
   n5sel <= ~load ? (~N[0]^N[4]) : N[5];
   ld01 <= lfsr[0] ? 1 : lfsr[1];
   ld12 <= lfsr[1] ? lfsr[2] : 0;
   ld34 <= lfsr[3] ? lfsr[4] : 0;
   l1234 <= ld12 ? ld34 : 0;
   load <= l1234 ? ld01 : 0;
   $display(lfsr[5:0]);
end
endmodule
// Create a wrapper around the module to test it with.
module top;
reg Fvco;
wire [5:0] N;
wire     Fback;
initial begin // {
   Fvco = 1'b0;
   // Store debussy waves and run for 300 ns
   $fsdbDumpfile("verilog.fsdb");
   $fsdbDumpvars;
   #300000;
   $fsdbDumpoff;
   $fsdbDumpflush;
   $finish;
end // }
always begin // {
   // Toggle the clock at 1GHz (1000ps cycle time)
   #500 Fvco = ~Fvco;
end // }
// Grab loop limit value from command line
assign N = 'Nconst;
lfsr_cnt ilfsr_cnt (
   .N(N),
   .Fvco(Fvco),
   .Fback(Fback));
always @(posedge Fback)
   $display($time,"Feedback going high.");
endmodule
Verilog for 4-input AND load
'timescale 1ps/1ps
// If you don't have debussy waves, remove the "fsdb" stuff near the end
// Run this using the command below to see a divide-by-51 count
// verilog lfsr.v +define+lfsrstart="6\'b000000"
+define+otherstart="4\'b0000"
+define+Nconst="6\'b101011"
// Run this using the command below to see a divide-by-24 count
// verilog lfsr.v +define+lfsrstart="6\'b111111"
+define+otherstart="4\'b1111"
+define+Nconst="6\'b100010"
// Here is a brief perl script to check that no power-up state of the 8
// internal registers can lock up a given count. Change Nconst and
// "die" condition to try other counts besides N=34, divide=24.
'ifdef not_defined
perl -e '$Nconst=46;'\
-e 'for ($lfsrstart=0; $lfsrstart<64; $lfsrstart++) {'\
-e 'for ($otherstart=0; $otherstart<16; $otherstart++) {'\
-e 'open (V,"verilog lfsr.v +define+lfsrstart=$lfsrstart
+define+otherstart=$otherstart
+define+Nconst=$Nconst | tee/tmp/$otherstart.out|");'\
-e '$pulse=0; while (<V>) {'\
-e 'if(/Feedback going high/) {'\
-e '$pulse++;'\
-e 'if($pulse == 3) {$old=$.+1};'\
-e 'if($pulse == 4) {die "Bad behavior,
see /tmp/$otherstart.out" if($.-$old != 41);};'\
-e'}}}}'
'endif
// This one-gate LFSR counter counts the sequence below.
// Next to each number in the sequence is the effective
// feedback divider count if "N" is set to that count.
// Note that 63 is not in the sequence and is an illegal
// value for N. (If the lfsr powers up as 63, it will
// cause a load to occur and get to a legal value).
// Sequential
// LFSR
// Values Divide value if N is set to this sequence value
// 61    Illegal value for N, lfsr recovers from this state.
// 59    Illegal value for N, lfsr recovers from this state.
// 55    Illegal value for N, lfsr recovers from this state.
// 47    Illegal value for N, lfsr recovers from this state.
// 30    Illegal value for N, lfsr recovers from this state.
// 60    59
// 57    58
// 51    57
// 39    56
// 14    55
// 29    54
// 58    53
// 53    52
// 43    51
// 22    50
// 44    49
// 24    48
// 48    47
// 33    46
//  2    45
//  5    44
// 11    43
// 23    42
// 46    41
// 28    40
// 56    39
// 49    38
// 35    37
//  6    36
// 13    35
// 27    34
// 54    33
// 45    32
// 26    31
// 52    30
// 41    29
// 18    28
// 36    27
//  8    26
// 17    25
// 34    24
//  4    23
//  9    22
// 19    21
// 38    20
// 12    19
// 25    18
// 50    17
// 37    16
```

```
// 10    15
// 21    14
// 42    13
// 20    12
// 40    11
// 16    10
// 32     9
//  0     8
//  1     7
//  3     6
//  7     5
// 15     4
// 31    Illegal value for N, lfsr uses this state.
// 62    Illegal value for N, lfsr uses this state.
//       Note that one state after 62 will have
//       lfsr[0] set, lfsr[4:1] = N[4:1] and
//       lfsr[5] equal to N[0] XNOR N[4].
//       Two states after "62" and lfsr will be
//       N[5:0].
module lfsr_cnt(
N,//6 bits of F/B divider limit in LFSR count
Fvco,//PLL VCO output
Fback);//PLL feedback clock
input [5:0]N;//6 bits of F/B divider limit
inputFvco;//PLL VCO output
outputFback;//PLL feedback clock
reg [5:0] lfsr;    // This is the counter, running very fast
reg     load;       // Active for 2 states in normal operation (count=31,62)
                    // Also insures we don't power up stuck at count=63
reg     n5sel;  // During the first load state, this register will be
                // the inverse of bit 0, during the second
                // load state, bit 0 will get set correctly and this
                // register is the value for bit 5 in the counter.
reg n3sel,n4sel;   // Insures load of only 1 cycle will recover to good
                    state.
assign Fback = load;
initial begin // {
  // Initialize from command line
  lfsr = 'lfsrstart;
  {load,n5sel,n4sel,n3sel} = 'otherstart;
end// }
always @(posedge Fvco) begin
  // All flops have only one "gate" in front of them
  // The gates are: 2-to-1 MUX, 4-to-1 AND
  lfsr[0] <= lfsr[4] ? lfsr[5] : ~lfsr[5];
  lfsr[1] <= load ? N[1] : lfsr[0];
  lfsr[2] <= load ? N[2] : lfsr[1];
  lfsr[3] <= load ? n3sel : lfsr[2];
  lfsr[4] <= load ? n4sel : lfsr[3];
  lfsr[5] <= load ? n5sel : lfsr[4];
  // The inverting of the "N" bits is not a gate in the critical
  // timing path since the "N" bits are assumed stable.
  n5sel <= load ? N[5] : ~N[0];
  n4sel <= load ? N[4] : 0;
  n3sel <= load ? N[3] : 0;
  load <= lfsr[4] & lfsr[3] & lfsr[2] & lfsr[1];
  $display(lfsr[5:0]);
end
endmodule
// Create a wrapper around the module to test it with.
module top;
reg Fvco;
wire [5:0] N;
wire    Fback;
initial begin // {
  Fvco = 1'b0;
  // Store debussy waves and run for 300 ns
  $fsdbDumpfile("verilog.fsdb");
  $fsdbDumpvars;
  #300000;
  $fsdbDumpoff;
  $fsdbDumpflush;
  $finish;
end // }
always begin // {
  // Toggle the clock at 1GHz (1000ps cycle time)
  #500 Fvco = ~Fvco;
end // }
// Grab loop limit value from command line
assign N = 'Nconst;
lfsr_cnt ilfsr_cnt (
  .N(N),
  .Fvco(Fvco),
  .Fback(Fback));
  always @(posedge Fback)
    $display($time," Feedback going high.");
endmodule
```

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A linear feedback shift register comprising a plurality of flip flop circuits coupled together wherein a logic path from any flip flop circuit of said plurality of flip flop circuits to any other flip flop circuit of said plurality of flip flop circuits goes through at most one multiplexer and no additional logic gates external to the multiplexer; and
wherein for a given input setting said linear feedback shift register generates an identical count sequence from any initial state of said plurality of flip flop circuits.

2. A linear feedback shift register as claimed in claim 1 wherein said linear feedback shift register is capable of operating as a counter and wherein flip flop circuit of said plurality of flip flop circuits is capable of detecting a load condition from said counter.

3. A linear feedback shift register as claimed in claim 1 comprising:
a first plurality of multiplexer flip flop circuits coupled together to form a counter circuit;
at least one multiplexer flip flop circuit coupled to said counter circuit, said at least one multiplexer flip flop circuit capable of controlling the loading of data into said counter circuit.

4. A linear feedback shift register as claimed in claim 3 further comprising:
a second plurality of multiplexer flip flop circuits coupled to said counter circuit, said second plurality of multiplexer flip flop circuits capable of detecting when said counter circuit has reached a limit.

5. A linear feedback shift register as claimed in claim 4 wherein said second plurality of multiplexer flip flop circuits is capable of detecting a load condition for said counter circuit from four bits of data.

6. A linear feedback shift register as claimed in claim 1 wherein said linear feedback shift register is capable of operating as a clock divider circuit.

7. A linear feedback shift register comprising:
a plurality of flip flop circuits coupled together wherein a logic path from any flip flop circuit of said plurality of flip flop circuits to any other flip flop circuit of said plurality of flip flop circuits goes through at most one multiplexer and no additional logic gates external to the multiplexer; and
wherein for a given input setting said linear feedback shift register generates an identical count sequence from any initial state of said plurality of flip flop circuits, wherein said plurality of flip flop circuits comprises:
a first plurality of multiplexer flip flop circuits coupled together to form a counter circuit;

a second plurality of multiplexer flip flop circuit coupled to said counter circuit, said second plurality of multiplexer flip flop circuits capable of controlling the loading of data into said counter circuit.

8. A linear feedback shift register as claimed in claim 7 further comprising:

a four input AND gate having each of four inputs coupled to an output of four multiplexer flip flop circuits of said counter circuit; and a flip flop circuit coupled to an output of said four input AND gate, said four input AND gate and said flip flop circuit capable of detecting when said counter circuit has reached a limit.

9. A linear feedback shift register as claimed in claim 8 wherein said four input AND gate and said flip flop circuit are capable of detecting a load condition for said counter circuit from four bits of data.

10. A linear feedback shift register as claimed in claim 8 wherein said linear feedback shift register is capable of operating as a clock divider circuit.

11. A method for providing a linear feedback shift register comprising the steps of:

coupling together a plurality of flip flop circuits wherein a logic path from any flip flop circuit of said plurality of flip flop circuits to any other flip flop circuit of said plurality of flip flop circuits goes through at most one multiplexer and no additional logic gates external to the multiplexer; and for a given input setting generating in said linear feedback shift register an identical count sequence from any initial state of said plurality of flip flop circuits.

12. A method as claimed in claim 11 further comprising the step of:

operating said linear feedback shift register as a counter.

13. A method as claimed in claim 11 comprising the steps of:

coupling together a first plurality of multiplexer flip flop circuits to form a counter circuit; and controlling the loading of data into said counter circuit with at least one multiplexer chip coupled to said counter circuit.

14. A method as claimed in claim 13 further comprising the step of:

detecting when said counter circuit has reached a limit with a second plurality of multiplexer flip flop circuits coupled to said counter circuit.

15. A method as claimed in claim 14 further comprising the step of:

detecting with said second plurality of multiplexer flip flop circuits coupled to said counter circuit a load condition for said counter circuit from four bits of data.

16. The method as claimed in claim 11 further comprising the step of:

operating said linear feedback shift register as a clock divider circuit.

* * * * *